United States Patent
Ishikawa (10) Patent No.: US 8,377,818 B2
(45) Date of Patent: Feb. 19, 2013

(54) AFTERTREATMENT METHOD FOR AMORPHOUS CARBON FILM

(75) Inventor: Hiraku Ishikawa, Sendai (JP)

(73) Assignee: Tokyo Electron Limited, Tokyo (JP)

( * ) Notice: Subject to any disclaimer, the term of this patent is extended or adjusted under 35 U.S.C. 154(b) by 824 days.

(21) Appl. No.: 12/308,828

(22) PCT Filed: Jul. 4, 2007

(86) PCT No.: PCT/JP2007/063376
§ 371 (c)(1),
(2), (4) Date: Aug. 20, 2009

(87) PCT Pub. No.: WO2008/004584
PCT Pub. Date: Jan. 10, 2008

(65) Prior Publication Data
US 2010/0062612 A1   Mar. 11, 2010

(30) Foreign Application Priority Data
Jul. 5, 2006   (JP) .................... 2006-185327

(51) Int. Cl.
*H01L 21/4763* (2006.01)
*H01L 21/302* (2006.01)

(52) U.S. Cl. ........ 438/622; 438/624; 438/778; 438/781; 257/E21.489

(58) Field of Classification Search ................. 438/778, 438/781, 622, 624; 257/E21.489
See application file for complete search history.

(56) References Cited

U.S. PATENT DOCUMENTS

| 6,346,747 | B1* | 2/2002 | Grill et al. ............ 257/752 |
| 6,573,030 | B1* | 6/2003 | Fairbairn et al. ...... 430/323 |
| 6,583,067 | B2* | 6/2003 | Chang et al. .......... 438/723 |
| 6,841,341 | B2 | 1/2005 | Fairbairn et al. |
| 2005/0158884 | A1* | 7/2005 | Gaynor .................. 438/4 |
| 2007/0077751 | A1* | 4/2007 | Chen et al. ............ 438/622 |

FOREIGN PATENT DOCUMENTS

| JP | H11-162469 A | 6/1999 |
| JP | 2000-345347 A | 12/2000 |
| JP | 2002-012972 A | 1/2002 |
| JP | 2003-282698 A | 10/2003 |
| JP | 2004-304177 A | 10/2004 |
| KR | 2003-7494 A | 1/2003 |

OTHER PUBLICATIONS

Text of First Office Action Notice (China), mailed on Dec. 18, 2009 Appl No. 2007800255121, 8 pgs, Code No. 975F.
Contents of Korean Office Action, dispatched on Sep. 27, 2010 Korean Patent Application No. 10-2008-7029490, issued by KIPO.

* cited by examiner

*Primary Examiner* — Michael Trinh
(74) *Attorney, Agent, or Firm* — Pearne & Gordon LLP (57) ABSTRACT

The present invention is an aftertreatment method further applied to an amorphous carbon film to which a treatment including heating is performed after the film has been formed on a substrate. The treatment of preventing oxidation of the amorphous carbon film is performed immediately after the treatment including heating.

15 Claims, 4 Drawing Sheets

Fig. 5 ional Stage application of PCT application Serial No. PCT/JP2007/063376, filed Jul. 4, 2007, entitled "Aftertreatment Method for Amorphous Carbon Film", which is incorporated herein by reference in its entirety.

AFTERTREATMENT METHOD FOR AMORPHOUS CARBON FILM

This application claims priority under 35 U.S.C. §371 as a National Stage application of PCT application Serial No. PCT/JP2007/063376, filed Jul. 4, 2007, entitled "Aftertreatment Method for Amorphous Carbon Film", which is incorporated herein by reference in its entirety.

TECHNICAL FIELD

The present invention relates to an aftertreatment for an amorphous carbon film suitable for a mask when manufacturing semiconductor devices. Further, the present invention relates to a manufacturing method of a semiconductor device using the aftertreatment method for such an amorphous carbon film.

BACKGROUND OF THE INVENTION

In a semiconductor device, an interlayer insulator is formed between interconnection layers. As such an interlayer insulator, a $SiO_2$ film has been used conventionally. However, a film with a lower permittivity has been desired along with the request for higher speed semiconductor devices in recent years. As such a low-permittivity film, organic materials mainly including Si containing Si, O, and C have been started to use.

However, in addition to a high cost, such a low-permittivity film mainly including Si has a problem that it is difficult to perform a high selectivity etching between other films. Therefore, a low-permittivity film that does not cause such a problem, has been desired.

As such a film, a hydrogen added amorphous carbon film has been considered. As disclosed in Japanese Unexamined Patent Application Publication No. 2002-12972, the amorphous carbon film can be deposited by a CVD using a hydrocarbon gas as a process gas. The amorphous carbon film is inexpensive and does not cause problems like the low-permittivity film mainly including Si.

By the way, in a manufacturing process of a semiconductor device, there are many cases where a film is heated to approximately 350 degrees Celsius to 400 degrees Celsius after forming the film and then a heat treatment, such as an annealing treatment, or other treatment is performed to prevent an alteration of each layer or change in dimensions in a final annealing treatment or based on a requirement of the process. However, when such heat is applied to the amorphous carbon film, a portion of the film is detached due to the disconnection in the portion relatively inferior to the heat on the amorphous carbon film surface. When the film is exposed to the atmosphere with this condition, the portion with the disconnected bond reacts with the oxygen or moisture in the atmosphere and oxidized, thereby the electric characteristics, such as permittivity and a leak current value, and a refractive index are significantly changed. When there is such a change in the characteristics, disadvantages, such as desired device characteristics cannot be obtained, will occur.

SUMMARY OF THE INVENTION

The present invention has been made considering above issues to effectively resolve them. An objective of the present invention is to provide an aftertreatment method for an amorphous carbon film such that the characteristics of the amorphous carbon film do not change significantly even when a treatment is performed under heating, such as annealing, after forming the amorphous carbon film.

Further, another objective of the present invention is to provide a manufacturing method of a semiconductor device to which the aftertreatment method for such an amorphous carbon film is applied.

The present invention is an aftertreatment method, which is further applied to amorphous carbon film to which a treatment including heating has been performed after the film has been formed on a substrate, wherein a treatment for preventing oxidization of the amorphous carbon film is performed immediately after the treatment including heating.

According to the present invention, because the treatment to prevent oxidation of the amorphous carbon film is performed as an aftertreatment immediately after the treatment including heating when the treatment including heating, such as annealing treatment, has been performed on the amorphous carbon film, the possibility for the deterioration in the electric characteristics etc. of the amorphous carbon film after a long lapse of time is less even when the film in left uncontrolled under an atmosphere including oxygen and hydrogen, such as the ambient atmosphere, thereafter.

Preferably, the treatment for preventing oxidation is a silylation treatment in which a silylation agent is contacted to the amorphous carbon film. In such a case, because a functional group with a high polarity, such as hydroxyl, formed on the surface of the amorphous carbon film is replaced to a group containing silicon and the surface of the amorphous carbon film is protected, thus, the possibility of the deterioration in the electric characteristics etc. of the amorphous carbon film is less without increasing the functional group of hydroxyl group after a long lapse of time even when the film is left uncontrolled under an atmosphere including oxygen or hydrogen, such as the ambient atmosphere, thereafter.

For example, the silylation treatment is performed by contacting vapor of the silylation agent to the surface of the amorphous carbon film. Further, the silylation treatment may be performed at a temperature in a range of room temperature to 200 degrees Celsius.

In such a case, the silylation agent is preferably one, two or more types selected from the group consisting of
HMDS (Hexamethyldisilan);
DMSDMA (Dimethylsilyldimethylamine);
TMSDMA (Dimethylaminotrimethylsilane);
TMDS (1,1,3,3-Tetramethyldisilazane);
TMSPyrole (1-Trimethylsilylpyrole);
BSTFA (N,O-Bis(trimethylsilyl)trifluoroacetamide) and
BDMADMS(Bis(dimethylamino)dimethylsilane).

For example, the treatment including heating is an annealing treatment.

Further, the treatment including heating is a treatment performed at a temperature in a range of 350 degrees Celsius to 400 degrees Celsius.

Alternatively, the present invention is a manufacturing method of semiconductor device, which includes the steps of forming an amorphous carbon film on a substrate, the amorphous carbon film being an interlayer insulator, applying a treatment including heating to the amorphous carbon film, applying a silylation treatment by contacting a silylation agent to the amorphous carbon film immediately after applying the treatment including heating, removing the silylation agent by heating the amorphous carbon film applied with the silylation treatment, and, forming a predetermined film on the amorphous carbon film immediately after removing the silylation agent.

According to the present invention, because the silylation treatment to contact the silylation agent to the amorphous carbon film is performed as an aftertreatment immediately after the treatment including heating when the treatment including heating, such as annealing treatment, has been performed to the amorphous carbon film, a functional group with a high polarity, such as hydroxyl, formed on the surface of the amorphous carbon film is substituted to a group containing silicon and the surface of the amorphous carbon film is protected, thus, the possibility of the deterioration in the electric characteristics etc. of the amorphous carbon film is less without increasing the functional group of hydroxyl group after a long lapse of time even when the film is left uncontrolled under an atmosphere including oxygen or hydrogen, such as the ambient atmosphere, thereafter.

In the present invention, for example, the silylation treatment is performed by contacting the vapor of the silylation agent to the surface of the amorphous carbon film. Further, the silylation treatment may be performed at a temperature in a rage of room temperature to 200 degrees Celsius.

In such a case, the silylation agent is also preferably one, two or more types selected from the group consisting of:

HMDS (Hexamethyldisilan);
DMSDMA (Dimethylsilyldimethylamine);
TMSDMA (Dimethylaminotrimethylsilane);
TMDS (1,1,3,3-Tetramethyldisilazane);
TMSPyrole (1-Trimethylsilylpyrole);
BSTFA (N,O-Bis(trimethylsilyl)trifluoroacetamide) and
BDMADMS(Bis(dimethylamino)dimethylsilane).

The treatment including heat is, for example, an annealing treatment.

The treatment including heating is, for example, a treatment performing at a temperature in a range of 350 degrees Celsius to 400 degrees Celsius.

The present invention is a computer readable memory medium storing a control program operated on a computer, where the control programs controls each related apparatus via the computer so as to perform the aftertreatment method for amorphous carbon film having any one of the features described above when executed.

The present invention is a computer readable memory medium storing a control program operated on a computer, where the control programs controls each related apparatus via the computer so as to perform the manufacturing method for semiconductor device having any one of the features described above when executed.

DETAILED DESCRIPTION OF INVENTION

Figure 1:
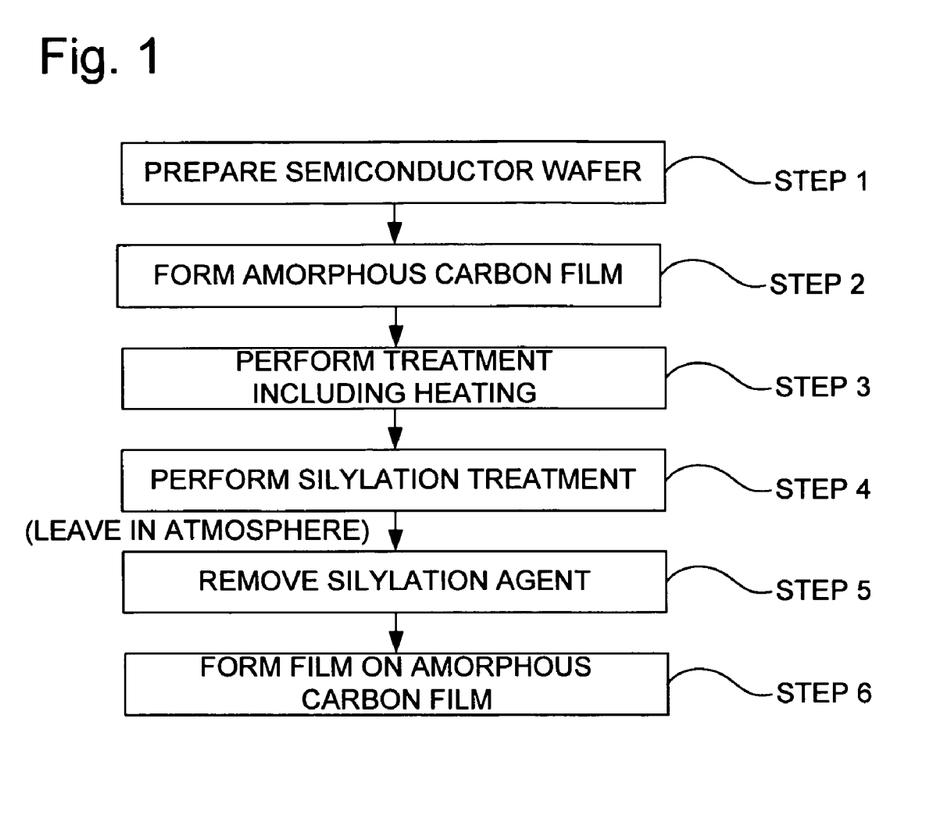
FIG. 1 is a flow chart illustrating a series of procedures including an embodiment of an aftertreatment of amorphous carbon film of the present invention.

Embodiments of the present invention will be explained with reference to attached figures. FIG. 1 is a flow chart illustrating a series of procedures including an embodiment of an aftertreatment method of amorphous carbon film of the present invention. FIGS. 2A to 2F are cross sectional views of a wafer corresponding to each step in the flowchart of FIG. 1.

First, a semiconductor wafer W (refer to FIG. 2A), on which, for example, a SiCO series low-permittivity film (Low-k film) 102 is formed on a silicon substrate 101 as an underlying film, is prepared (step 1). Next, an amorphous carbon film 103 is formed on the underlying film 102 (step 2, FIG. 2B).

Figure 2:
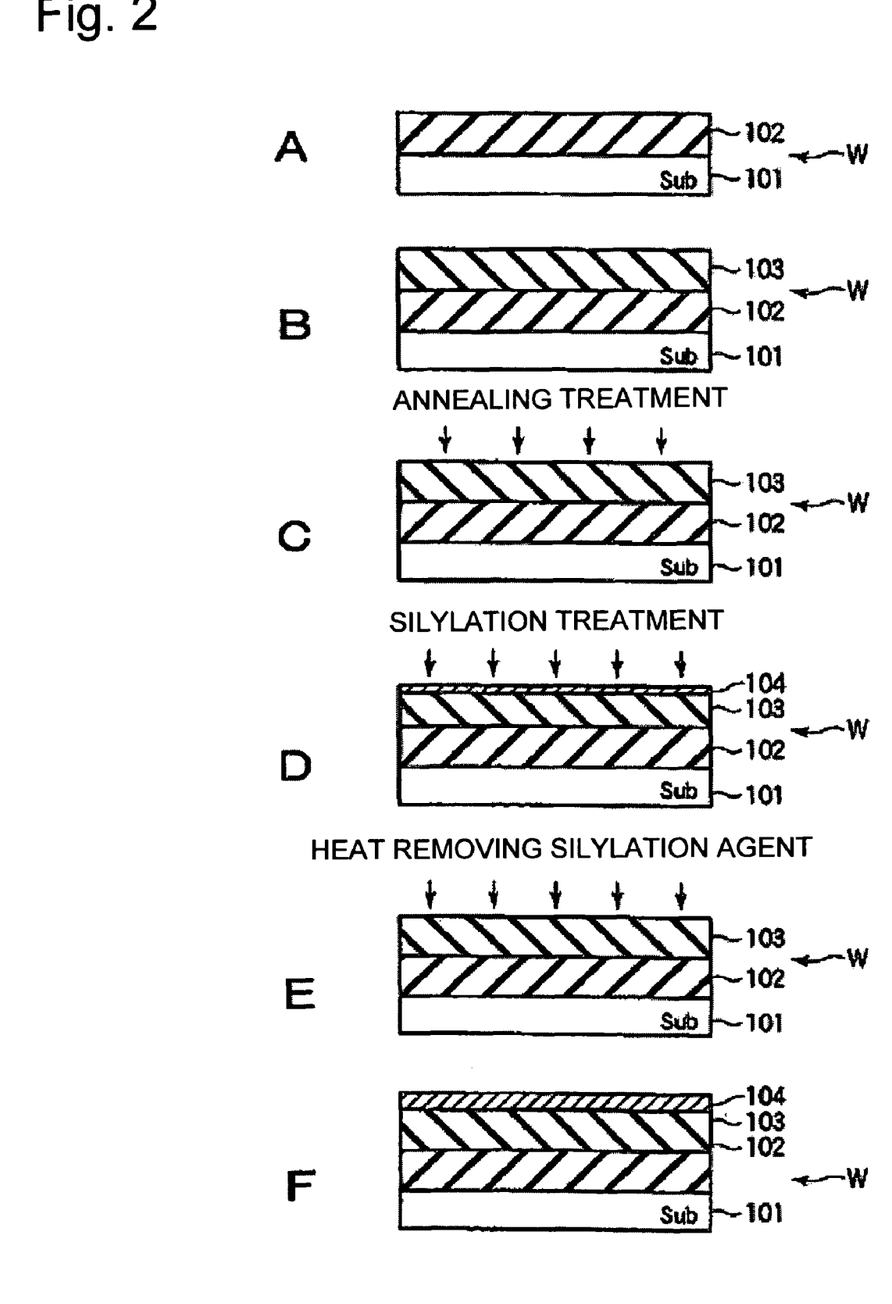
FIGS. 2A to 2F are cross sectional views of a wafer corresponding to each step of the flowchart in FIG. 1.

The forming method for the amorphous carbon film 103 is not limited specifically, and is preferably formed by a CVD (Chemical Vapor Deposition) method. In this case, a hydrocarbon gas, such as, propylene ($C_3H_6$), propyne ($C_3H_4$), propane ($C_3H_8$), butane ($C_4H_{10}$), butylenes ($C_4H_{10}$), butadiene ($C_4H_6$), and acetylene ($C_2H_2$) etc., and the gas mainly formed of these compounds may be used as a process gas. By using such a process gas, film deposition may be performed by the method disclosed in Japanese Unexamined Patent Application Publication No. 2002-12972, for example. Further, a rigid carbon network may be formed under a forming condition of relatively low temperature by including more oxygen in the process gas.

After the amorphous carbon film 103 is formed, a treatment including heating, such as annealing treatment, is performed (step 3, FIG. 2C). This treatment is performed under arbitral conditions according to the semiconductor element to be obtained. Commonly, the treatment is performed in a non-oxidizing atmosphere (vacuum or inner gas of Ar, $N_2$ etc.) under a temperature condition about 350 degrees Celsius to 400 degrees Celsius.

The amorphous carbon film 103 immediately after the film has been formed has a sound surface condition and does not change after a long lapse of time even when it is taken out in the atmosphere. However, when the treatment including heating, such as annealing treatment, is performed, a portion of the film is desorbed due to the detachment of bonding in the portion on the surface of the amorphous carbon film 103 where it is relatively weak to heat. Therefore, when the film is exposed in the atmosphere after such a treatment including heat, the portions where the bonding is detached react with the oxygen and moisture in a relatively short time and shows following reaction; —C—C.+$O_2$→—C—=O+O*, —C—CH+O*→—C—C—OH, —C—C.+$H_2O$→—C—C—OH+H, and then oxidized. Thereby a functional group having a polarizable property, such as a carbonyl group or a hydroxyl group, is generated in the film. Further, such a functional group increases after a long lapse of time.

Such a functional group absorbs moisture or changes the electric characteristics, such as permittivity, or other characteristics significantly. For example, the relative permittivity for the amorphous carbon film as formed is about k=2.8. And the characteristics are improved once to k=2.6 to 2.7 immediately after performed an annealing at about 400 degrees Celsius. However, the k value exceeds 3 and the leak characteristics is also decreased when the film is left uncontrolled about 100 hours or more in the atmosphere. Increase in the refractive index is also seen when leaving the film uncontrolled for a long time in this way.

In order to prevent change in the electric characteristics etc. after a long lapse of time, a silylation treatment, which is the aftertreatment of the present invention, is performed immediately after the treatment including heating of step 3 (step 4, FIG. 2D). The silylation treatment is a treatment for replacing the functional group having a polarizable property, such as carbonyl group or hydroxyl group formed on the surface of the amorphous carbon film 103 to a group containing silicon by reacting the functional group and the silylation agent. By this, the surface of the amorphous carbon film is protected, and the change of characteristics after a long lapse of time due to the increase in the functional group, such as a carbonyl group or a hydroxyl group, can be prevented. The value of permittivity "k" slightly increases immediately after such a silylation treatment. However, the value hardly changes after leaving the film uncontrolled in the atmosphere. As for the refractive index, the value hardly changes even when leaving the film in the atmosphere after the silylation treatment. Here, "immediately after the treatment including heating" means that after the period, in which the deterioration of the characteristics hardly occurs after the treatment including heating is performed.

As a silylation agent, any substance that generates the silylation reaction can be used without limitation. However, preferably the substance having a relatively small molecular structure among the compound group having a silazane bond (Si—N bond) in the molecule is used. Concretely, for example, following may be used:

HMDS (Hexamethyldisilan);
DMSDMA (Dimethylsilyldimethylamine);
TMSDMA (Dimethylaminotrimethylsilane);
TMDS (1,1,3,3-Tetramethyldisilazane);
TMSPyrole (1-Trimethylsilylpyrole);
BSTFA (N, O-Bis(trimethylsilyl)trifluoroacetamide) and
BDMADMS(Bis(dimethylamino)dimethylsilane).

And the chemical structures of these are shown as follows:

[Formula 1]

The silylation reaction is indicated by a following chemical formula in an example using DMSDMA as a silylation agent, and OH group in the film is replaced in a form of O—Si.

[Formula 2]

The silylation treatment may be performed by contacting the silylation agent to the amorphous carbon film. Typically, the treatment may be performed by contacting the vapor of the silylation agent on the surface of the amorphous carbon film as described later. The treatment may also be performed by applying the silylation agent on the amorphous carbon film.

By performing the silylation treatment in this way, the deterioration in characteristics of the amorphous carbon film may be prevented even when the semiconductor substrate is left uncontrolled in the atmosphere. However, the deposition of a capping film or metal film etc., which is a subsequent process, cannot be performed when the condition is left as it is after performing the silylation treatment. Therefore, the silylation agent on the surface of the amorphous carbon film is heated and removed prior to the subsequent process (step 5, FIG. 2E). This heat removing process of the silylation agent is performed under a reduced pressure atmosphere of not greater than 133 Pa(1 Torr). About 200 degrees Celsius is sufficient as a temperature at this time. By this heat removing process of the silylation agent, the electric characteristics, such as permittivity, return to the characteristics prior to the treatment including heating of step 3.

After the heat removing process of step 5, a predetermined film 104, such as $SiO_2$, SiN, SiCN, and SiCO, which function as a capping film or hard mask, or Cu, Ti, Ta, and W etc as a metal film, is formed on the amorphous carbon film (step 6, FIG. 2F). In such case, the characteristics of the amorphous carbon film do not decrease due to the protection effect of the silylation treatment described above. Therefore, a device having favorable characteristics can be manufactured by a series of subsequent processes.

Figure 3:
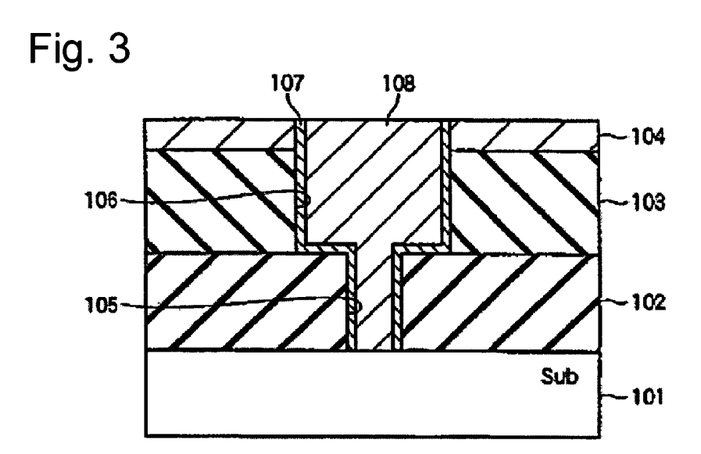
FIG. 3 is a cross sectional view illustrating an example of a structure obtained by an embodiment of a manufacturing method for a semiconductor device of the present invention.

Next, a manufacturing method for a semiconductor device including the processes described above will be explained. For example, in a case when a copper is buried using a dual machine method, the etching of a hole and trench and the bury of Cu film are performed from the condition shown in FIG. 2E, thereby the semiconductor device of the structure shown in FIG. 3 can be obtained. Concretely, after the silylation agent heat removing process of FIG. 2E is performed, a hard mask is formed as the film 104 which brings the condition shown in FIG. 2F, and then the hole 105 is etched on the Low-k film 102 and the trench 106 is etched on the amorphous carbon film 103, thereafter, the barrier film 107 and Cu film 108 are formed.

Figure 4:
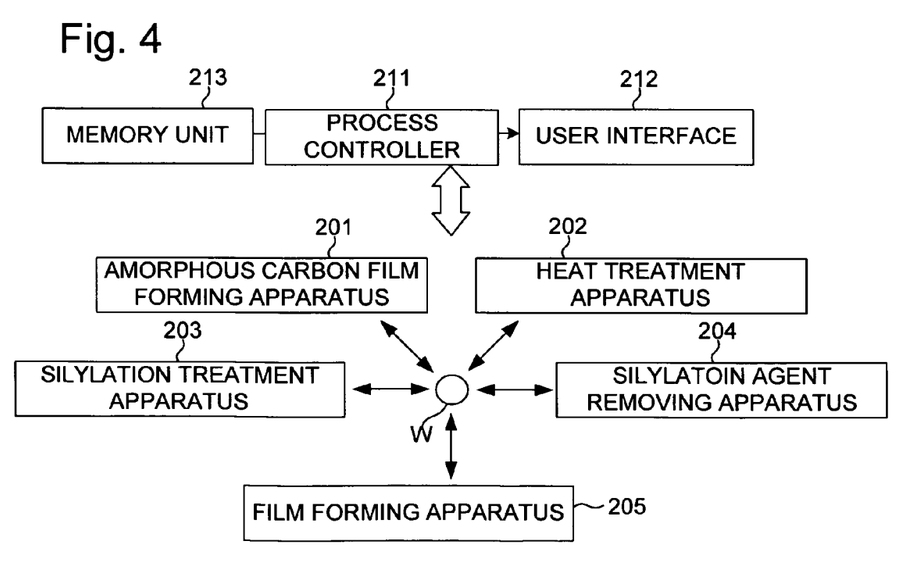
FIG. 4 is a block diagram explaining a processing apparatus group for executing an embodiment of a manufacturing method for a semiconductor device of the present invention.

Next, a processing apparatus group for performing a series of process shown in FIG. 1 will be explained. FIG. 4 is a block diagram illustrating the processing apparatus group for performing a series of processes described above. This processing apparatus group has an amorphous carbon forming apparatus for forming an amorphous carbon film on a predetermined film formed on a semiconductor wafer, for example, a SiCO series low permittivity film (Low-k film), a heat treatment apparatus 202 for performing a heat treatment, such as annealing treatment, to the semiconductor wafer formed with the amorphous carbon film, a silylation treatment apparatus 203 for performing a silylation treatment on the amorphous carbon film on the semiconductor wafer that is heat treated, a silylation agent removing apparatus 204 for removing the silylation agent applied on the surface of the amorphous carbon film at the silylation treatment, and a forming apparatus 205 for forming a predetermined film on the amorphous carbon film after the silylation agent is removed. In addition, in a case when the wafer W is transferred between each apparatus, a transfer apparatus (not shown) is used or the transfer is performed by an operator.

Each of these apparatuses is in a form that is collectively controlled by a process controller 211 provided with a microprocessor (computer). The process controller 211 is connected to a user interface 212 including a keyboard for inputting a command for controlling each apparatus by a process manager or a display for visually showing the operating status of each apparatus, and a memory unit 213 for storing a recipe in which a control program or process condition data for realizing various processes executed in each apparatus through the control of the process controller 211 is stored.

As needed, an arbitrary recipe or control program is called from the memory unit 213 according to an instruction etc. from the user interface 212, and is used in the process controller 211. By this, a desired series of processes is performed in the processing apparatus group under the control of the process controller 211. Further, the recipe or control program may be in a state in which it is stored in a readable memory medium, such as a CD-ROM, hard disk, flexible disk, or nonvolatile memory etc. Alternatively, the recipe or control program may be transferred on-line between each apparatus, or from an external apparatus, for example, via a dedicated line, as needed.

Figure 5:
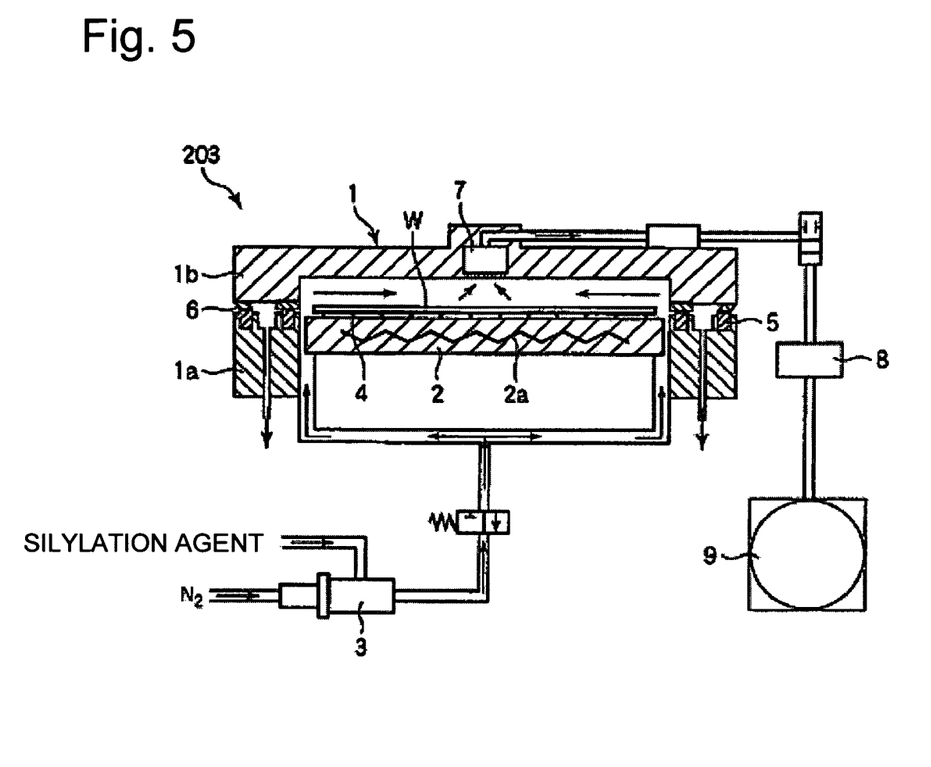
FIG. 5 is a cross sectional view illustrating an outline configuration of a silylation treatment apparatus in the processing apparatus group of FIG. 4.

Next, the silylation treatment apparatus 203 for performing a silylation treatment, which is an aftertreatment of the amorphous carbon film, will be explained in detail. FIG. 5 is a cross sectional view illustrating an outline configuration of a silylation treatment apparatus. As shown in FIG. 5, the silylation treatment apparatus 203 is provided with a chamber 1 for storing the wafer W. The chamber 1 is formed from a fixed lower container 1a and a lid body 1b for covering the upper portion of the lower container 1a. The lid body 1b is elevatable by an elevation apparatus (not shown). A hot plate 2 is provided to the lower container 1a. And, the vapor of any silylation agents is provided into the chamber 1 through the space between the circumference of the hot plate 2 and the inner face of the lower container 1a. The silylation agent is vaporized in a vapor state by a vaporizer 3 and is supplied to the chamber 1 using $N_2$ gas as a carrier gas.

Inside of the hot plate 2, a heater 2a is installed. By this heater 2a, for example, the temperature can be controlled in a temperature range of room temperature to 200 degrees Celsius. On the surface of the hot plate 2, a pin 4 is provided to support the semiconductor wafer W. The backside of the wafer W can be prevented from a contamination by not placing the semiconductor wafer W directly on the hot plate 2.

On the upper face of the outer circumference of the lower container 1a, a first seal ring 5 is provided. Meanwhile, on the lower face of the outer circumference of the lid body 1b, there is provided a second seal ring 6, which contacts a first seal ring 5 when the lid body 1b is pressed onto the lower container 1a. A pair of these first seal ring 5 and second seal ring 6 is provided in the inner side and the outer side (double, which includes two sets of rings), and the space in between them can be depressurized. By depressurizing this space, the airtightness of the chamber 1 can be secured.

An exhaust opening 7 is provided to a substantially center section of the lid body 1b to exhaust the silylation agent and nitrogen gas supplied to the chamber 1. This exhaust opening 7 is connected to a vacuum pump 9 through a pressure adjustment apparatus 8.

In the silylation treatment apparatus 203 formed in this way, the semiconductor wafer W is transferred into the chamber 1 while the lid body 1b is elevated, and then placed on the pin 4 of the hot plate 2. Next, inside of the chamber 1 is made to a hermetical space by descending the lid body 1b, and the airtightness is increased by further reducing the pressure in the chamber 1. Under this condition, the hot plate 2 is controlled to a predetermined temperature in a range of room temperature to 200 degrees Celsius, and the temperature of vaporizer 3 is controlled to a predetermined temperature in a range of room temperature to 50 degrees Celsius, the silylation agent is supplied, for example, at 0.1 to 1.0 g/min, the $N_2$ gas (purge gas) is supplied at a flow rate of 1 to 10 L/min, and the processing pressure is controlled to 666 to 96000 Pa (5 to 720 Torr), thereby the silylation treatment is performed for about one minute. By this, the vapor of the silylation agent is supplied on the amorphous carbon film formed on the semiconductor wafer W, and the silylation reaction is generated on the surface, thereby a protection film is formed.

Next, an experiment result for confirming the effect of the present invention will be explained. Here, various processes are applied to the amorphous carbon film formed by the CVD using a hydrocarbon gas described above, and the electric characteristics (relative permittivity and leak current when 1MV is applied) are measured thereafter. In addition, these characteristics are indicated by the mean value of three measurements.

First, as a sample No. 1, the relative permittivity and the leak current of the amorphous carbon film immediately after forming the film were 2.84 and $1.52 \times 10^{-8}$ A/cm$^2$ respectively.

Next, as a sample No. 2, the relative permittivity and the leak current are measured after left the film uncontrolled for 100 hours under the atmosphere after forming the film. Results were 2.87 and $1.17 \times 10^8$ A/cm$^2$ respectively. That is, there was no significant difference.

Further, as a sample No. 3, the relative permittivity and leak current were measured immediately after performing the annealing (under Ar atmosphere) for 30 minutes at 400 degrees Celsius after forming the film. The results were 2.61 and $1.39 \times 10^{-9}$ A/cm$^2$ respectively. That is, these characteristics showed improvements.

Next, as a sample No. 4, the film was left uncontrolled in the atmosphere for 100 hours after performing the same annealing treatment of sample No. 3. Thereafter the relative permittivity and leak current were measured. The results are 3.05 and $8.56 \times 10^{-9}$ A/cm$^2$ respectively. That is, it was confirmed that the electric characteristics were deteriorated by leaving the film uncontrolled under the atmosphere after the annealing treatment.

For a sample No. 5, the time for leaving the film uncontrolled was extended to 200 hours. In this case, the relative permittivity and leak current were 3.33 and $3.76 \times 10^{-8}$ A/cm$^2$ respectively.

For sample No. 6, the time for leaving the film uncontrolled was extended to 500 hours. In this case, the relative permittivity and leak current are 5.73 and $8.69 \times 10^{-6}$ A/cm$^2$ respectively.

That is, it is confirmed that as the time for leaving the film uncontrolled is longer after the annealing treatment, the deterioration in the characteristics is more significant.

Next, as a sample 7, the film was left uncontrolled for 100 hours after the anneal treatment, and then a bake treatment was performed at 200 degrees Celsius, thereafter the electric characteristics were measured. As a result, the relative permittivity is 3.12 and the leak current was $2.66 \times 10^{-9}$ A/cm$^2$. That is, it was confirmed that the leak current is slightly improved but the relative permittivity did not recover, and the characteristics were still not sufficient compared to the sample No. 4.

Further, as a No. 8 sample, the film was left uncontrolled for 200 hours under the atmosphere after the annealing treatment is performed for 30 minutes at a temperature condition of 400 degrees Celsius under the atmosphere in which 10% of 112 gas was added to Ar, and then the electric characteristics were measured. As a result, the relative permittivity was 3.29 and the leak current was $8.44 \times 10^{-9}$ A/cm$^2$. This result showed a little improvement but still the characteristics were insufficient compare to the sample No. 5 to which the annealing treatment was performed under the Ar atmosphere without a H$_2$ gas.

Meanwhile, as a sample No. 9, the annealing treatment was performed for 30 minutes at a temperature condition of 400 degrees Celsius under the atmosphere in which 10% of H$_2$ gas was added as the sample No. 8 after the amorphous carbon film was formed. Then the silylation treatment was performed for five minutes at the room temperature using HMDS as a silylation agent by the silylation treatment apparatus of FIG. 4, and the film was left uncontrolled for 200 hours under the atmosphere, thereafter, the electric characteristics were measured. As a result, the relative permittivity was 2.87 and the leak current was $4.52 \times 10^{-9}$ A/cm$^2$. That is, the electric characteristics were favorable compared to the sample No. 8. Namely, it was confirmed that the electric characteristics hardly deteriorated even when the film was left uncontrolled under the atmosphere by apply the silylation treatment to the amorphous film after annealing.

Further, as a sample No. 10, an annealing treatment was performed again for 30 minutes under a temperature condition of 400 degrees Celsius in an atmosphere in which H$_2$ gas of 10% was added after the processes up to silylation treatment is performed as the sample No. 9. Thereafter, the film was left uncontrolled for 200 hours, and then the electric characteristics were measured. As a result, the relative permittivity was 2.73 and the leak current was $4.75 \times 10^{-9}$ A/cm$^2$. That is, the electric characteristics was not improved even when the annealing treatment was performed again.

Further, as a sample No. 11, the same silylation treatment as the sample No. 9 was performed after forming the amorphous carbon film. Thereafter, an annealing treatment was performed for 30 minutes under a temperature condition of 400 degrees Celsius in an atmosphere in which H$_2$ gas of 10% was added, the film was left uncontrolled in the atmosphere for 200 hours, and then the electric characteristics were measured. As a result, the relative permittivity was 3.45 and the leak current was $3.64 \times 10^{-8}$ A/cm$^2$. That is, it was confirmed that the electric characteristics were not improved compared to the sample No. 8 and the effect has not been obtained by performing the silylation treatment before the anneal treatment.

Based on the above, it is confirmed that the electric characteristics do not deteriorate, even when an amorphous carbon film is left uncontrolled in the atmosphere for the long time by performing the silylation treatment after forming the amorphous carbon film and then an annealing treatment is performed at about 400 degrees Celsius. In addition, the silylation treatment is performed in a room temperature in the experiment described above. However, it can be anticipated that the effect is further increased by increasing the temperature at the treatment to about 100 degrees Celsius to 200 degrees Celsius.

In addition, the present invention is not limited to the embodiment described above, and various modifications can be applied. For example, the silylation treatment has been explained as an example of the treatment to prevent oxidization of the amorphous carbon. However, the treatment is not specifically limited as long as it can prevent the oxidation of the amorphous carbon. Further, the example of applying the amorphous carbon film is explained in the embodiments as an interlayer insulator. However, the film may be applied as another purpose, such as anti-reflection film etc. That is, it is important for the anti-reflection film that the refractive index to be a specific value. However, there is a case where the refractive index increases after a long lapse of time by leaving the film in the atmosphere after a treatment including heating. According to the aftertreatment of the present invention, such a change after a long lapse of time can be prevented and the stable characteristics as the anti-reflection film can be obtained.

Further, in the embodiments described above, the case where the film is left uncontrolled in the atmosphere after performing the treatment including annealing, has been considered. However, the same effect can also be obtained in a case when the film is left uncontrolled in other atmosphere including the oxygen and hydrogen in a certain degree, not limited to the atmosphere.

Further, the semiconductor wafer is shown as an example of a substrate to be treated in the embodiment and not limited to this. The present invention can be applied to other substrates, such as a glass substrate for a flat panel display (FPD) as represented by a liquid crystal display device (LCD).

The present invention is widely applicable for a purpose of using the characteristic of the amorphous carbon film, that is, low permittivity.

What is claimed is:

1. A method comprising:
   forming an amorphous carbon film on a substrate;
   after forming the amorphous carbon film, heating the amorphous carbon film in a non-oxidizing atmosphere;
   performing a treatment to prevent oxidation of the amorphous carbon film immediately after completion of the heating of the amorphous film; and
   after performing the treatment, forming another film on the amorphous carbon film.

2. The method according to claim 1, wherein the treatment to prevent the oxidation is a silylation treatment in which a silylation agent is contacted to the amorphous carbon film.

3. The method according to claim 2, wherein the silylation treatment is performed by contacting the vapor of the silylation agent to a surface of the amorphous carbon film.

4. The method according to claim 2, wherein the silylation treatment is performed at a temperature ranging from room temperature to 200 degrees Celsius.

5. The method according to claim 2, wherein the silylation agent is one, two or more types selected from the group consisting of HMDS (Hexamethyldisilan), DMSDMA (Dimethylsilyldimethylamine), TMSDMA (Dimethylaminotrimethylsilane), TMDS (1,1,3,3-Tetramethyldisilazane), TMSPyrole (1-Trimethylsilylpyrole), BSTFA (N,O-Bis(trimethylsilyl)trifluoroacetamide) and BDMADMS(Bis(dimethylamino)dimethylsilane.

6. The method according to claim 1, wherein the heating of the amorphous carbon film is an annealing treatment.

7. The method according to claim 1, wherein the heating of the amorphous carbon film is performed at a temperature ranging from 350 degrees Celsius to 400 degrees Celsius.

8. A manufacturing method for a semiconductor device comprising:
   forming an amorphous carbon film on a substrate, the amorphous carbon film being an interlayer insulator;
   after forming the amorphous carbon film, heating the amorphous carbon film in a non-oxidizing atmosphere;
   applying a silylation treatment by contacting a silylation agent to the amorphous carbon film immediately after completion of the heating of the amorphous carbon film;
   removing the silylation agent by heating the amorphous carbon film, to which the silylation treatment has been applied; and
   forming a predetermined film on the amorphous carbon film immediately after removing the silylation agent.

9. The manufacturing method of a semiconductor device according to claim 8, wherein the silylation treatment is performed by contacting vapor of the silylation agent to a surface of the amorphous carbon film.

10. The manufacturing method of a semiconductor device according to claim 8, wherein the silylation treatment is performed at a temperature ranging from room temperature to 200 degrees Celsius.

11. The manufacturing method of a semiconductor device according to claim 8, wherein the silylation agent is one, two or more types selected from the group consisting of HMDS (Hexamethyldisilan), DMSDMA (Dimethylsilyldimethylamine), TMSDMA (Dimethylaminotrimethylsilane), TMDS (1,1,3,3-Tetramethyldisilazane), TMSPyrole (1-Trimethylsilylpyrole),BSTFA (N,O-Bis(trimethylsilyntrifluoroacetamide) and SDMADMS(Bis(dimethylamino)dimethylsilane.

12. The manufacturing method of a semiconductor device according to claim 8, wherein the heating of the amorphous carbon film is an annealing treatment.

13. The manufacturing method of a semiconductor device according to claim 8, wherein the heating of the amorphous carbon film is performed at a temperature ranging from 350 degrees Celsius to 400 degrees Celsius.

14. A non-transitory computer readable memory medium for storing a control program, which operates on a computer, wherein the control program controls each related apparatus via the computer for performing the method according to claim 1.

15. A non-transitory computer readable memory medium for storing a control program, which operates on a computer, wherein the control program controls each related apparatus via the computer for performing the manufacturing method according to claim 8.

* * * * *

UNITED STATES PATENT AND TRADEMARK OFFICE
CERTIFICATE OF CORRECTION

PATENT NO. : 8,377,818 B2
APPLICATION NO. : 12/308828
DATED : February 19, 2013
INVENTOR(S) : Hiraku Ishikawa Page 1 of 1

It is certified that error appears in the above-identified patent and that said Letters Patent is hereby corrected as shown below:

In the specification, column 4, line 14, please delete "$C_4H_{10}$" and add -- $C_4H_8$ --

In the specification, column 4, lines 42-44, delete " -C-C+O₂→-C- =O+O*, -C-CH+O*→-C-C-OH, -C-C+H₂O→-C-C-OH+H, " and add-- -C-C+O₂→-C-C=O+O*, -C-CH+O*→-C-C-OH, -C-C+H₂O→-C-C-OH+H, --.

In the specification, column 8, line 26, please delete "$10^8$" and add -- $10^{-8}$ --

In the specification, column 8, line 66, please delete "112" and add -- $H_2$ --

Signed and Sealed this
Ninth Day of July, 2013

Teresa Stanek Rea
*Acting Director of the United States Patent and Trademark Office*